(12) United States Patent
Breitwisch et al.

(10) Patent No.: US 7,868,313 B2
(45) Date of Patent: Jan. 11, 2011

(54) PHASE CHANGE MEMORY DEVICE AND METHOD OF MANUFACTURE

(75) Inventors: Matthew J. Breitwisch, Yorktown Heights, NY (US); Chung H. Lam, Peekskill, NY (US); Hsiang-Lan Lung, Elmsford, NY (US); Bipin Rajendran, White Plains, NY (US); Alejandro G. Schrott, New York, NY (US); Yu Zhu, West Harrison, NY (US)

(73) Assignees: International Business Machines Corporation, Armonk, NY (US); Macronix International Co., Ltd. (TW)

( * ) Notice: Subject to any disclaimer, the term of this patent is extended or adjusted under 35 U.S.C. 154(b) by 0 days.

(21) Appl. No.: 12/111,258

(22) Filed: Apr. 29, 2008

(65) Prior Publication Data
US 2009/0268507 A1 Oct. 29, 2009

(51) Int. Cl.
*H01L 21/00* (2006.01)
(52) U.S. Cl. .................... 257/4; 257/2; 257/3; 257/528; 257/E45.002; 257/E47.001; 257/E47.005; 438/95; 438/102
(58) Field of Classification Search .................. 257/2, 257/4, 528, 529, 3, E45.002, E47.001, E47.005; 438/95, 102
See application file for complete search history.

(56) References Cited

U.S. PATENT DOCUMENTS

| 4,845,533 | A | 7/1989 | Pryor et al. | |
| 7,113,474 | B2 | 9/2006 | Ovshinsky et al. | |
| 2007/0075347 | A1 | 4/2007 | Lai et al. | |
| 2007/0158631 | A1 | 7/2007 | Daley et al. | |
| 2007/0215852 | A1* | 9/2007 | Lung | 257/4 |
| 2008/0173858 | A1* | 7/2008 | An et al. | 257/3 |
| 2008/0179585 | A1* | 7/2008 | Hsu | 257/4 |
| 2008/0210924 | A1* | 9/2008 | Shin | 257/4 |
| 2009/0008621 | A1* | 1/2009 | Lin et al. | 257/3 |

* cited by examiner

*Primary Examiner*—Davienne Monbleau
*Assistant Examiner*—Farid Khan
(74) *Attorney, Agent, or Firm*—Cantor Colburn LLP; Vazken Alexanian

(57) ABSTRACT

A phase change memory control ring lower electrode is disclosed. The lower electrode includes an outer ring electrode in thermal contact with a phase change memory element, an inner seed layer disposed within the outer ring electrode and in contact with the phase change memory element, and an electrically conductive bottom layer coupled to the outer ring electrode.

14 Claims, 6 Drawing Sheets

PHASE CHANGE MEMORY DEVICE AND METHOD OF MANUFACTURE

BACKGROUND OF THE INVENTION

This invention relates generally to memory devices and, more particularly, to phase change memory devices and particular bottom electrode configurations thereof.

Phase-change memory (also known as PCM, PRAM, PCRAM, Ovonic Unified Memory and Chalcogenide RAM C-RAM) is a type of non-volatile computer memory. PCM devices use the unique behavior of chalcogenide glass, which can be "switched" between two states, crystalline and amorphous, with the application of heat. PCM memory devices are one of a number of new memory technologies that are attempting to compete in the non-volatile role with the almost universal Flash memory, which has a number of practical problems these replacements hope to address.

Chalcongenide glass is an example of a material that shall be referred to herein as a "phase-change material." A phase-change material is characterized in that it exists in two main states, crystalline and amorphous. The amorphous state has a high resistance and the crystalline state has a lower resistance by comparison. As such, the material may be used to represent one of two binary states.

To convert the material from the crystalline to the amorphous state (i.e., to "reset" the material) a high current may be applied such that the temperature of the phase-change material exceeds about 600 degrees C. This requires a pulse of current lasting only a few nano-seconds to be applied to the phase change material.

To "set" the phase-change material, i.e., to convert it from its amorphous state to its crystalline state, the phase-change material is heated to a temperature below about 400 degrees C. and above about 200 degrees C. and held at that temperature for some duration of time and then allowed to cool according to the shape of the decay of the pulse applied thereto. In some instances, the total time required to set the phase-change material can be up to 100 nano-seconds or more. In short, at present the set time for a phase-change material is substantially longer than its reset time. It would, therefore, be desirable to reduce the set time for a phase-change memory device.

BRIEF SUMMARY OF THE INVENTION

Some embodiments of the present invention may serve to reduce the set time for a phase-change memory device. One embodiment which may accomplish this goal is a bottom electrode of a phase change memory device that includes a seed layer disposed therein that causes the phase-change material to, upon application of an appropriate current, change from its amorphous state to its crystalline state faster than some prior art devices.

One embodiment of the present invention is directed to a phase change memory control ring lower electrode. The lower electrode of this embodiment includes an outer ring electrode in thermal contact with a phase change memory element. The lower electrode of this embodiment also includes an inner seed layer disposed within the outer ring electrode and in contact with the phase change memory element, and an electrically conductive bottom layer coupled to the outer ring electrode.

Another embodiment of the present invention is directed to a phase change memory device. The phase change memory device of this embodiment includes an upper electrode having an upper side and a lower side and a phase change material layer having an upper side and a lower side, the upper side of the phase change material layer contacting the lower side of the upper electrode. The phase change memory device of this embodiment also includes a bottom electrode having a bottom electrode height and an outer perimeter and in thermal contact with the lower side of the phase change material layer. The phase change memory device of this embodiment also includes a seed layer disposed within the outer perimeter of the bottom electrode and in contact with the bottom side of the phase change material.

Another embodiment of the present invention is directed to a method of manufacturing a phase change memory device comprising: creating a bottom electrode having an outer perimeter; depositing a seed layer within the outer perimeter of the bottom electrode; and placing a phase change material layer in thermal contact the outer perimeter of the bottom electrode and the seed layer.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

An exemplary embodiment of the present invention provides a bottom electrode that is configured in a manner that may cause a phase-change material to change from its amorphous state to its crystalline state more quickly.

Figure 1:
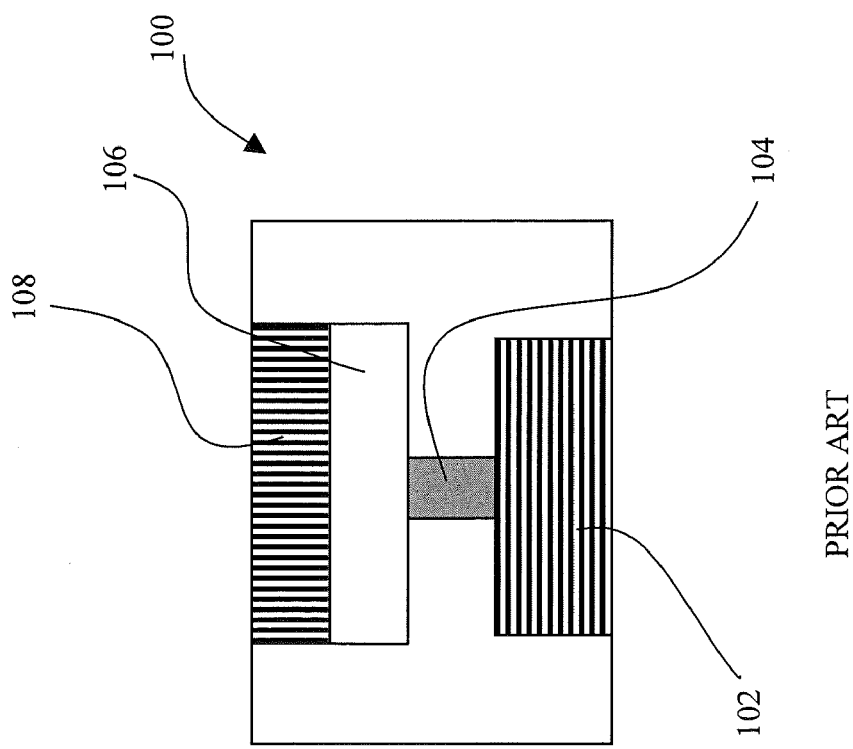
FIG. 1 shows an example of a prior art phase-change memory device.

FIG. 1 shows an example of a prior art phase-change memory device 100. The phase-change memory device of FIG. 1 includes a bottom contact electrode 102. This bottom electrode contact 102 may be coupled to electrical power or ground. The bottom electrode contact 102 is electrically coupled to a bottom electrode 104. Of course, the bottom electrode 104 and the bottom electrode contact 102 may be a unitary piece. As shown, the bottom electrode 104 is a solid cylindrical electrode. The bottom electrode could be made of, for example, a metal.

The phase-change memory device 104 also includes a phase change material layer 106 disposed between the bottom electrode 104 and an upper electrode 108. As shown, the phase-change material layer 106 is in its amorphous, high-resistance state. The upper electrode 108 may be electrically coupled to the other of electrical power or ground depending on which of electrical power or ground the bottom electrode contact 102 is coupled to.

In operation, voltage applied across the phase-change memory device 100 (between the upper electrode 108 and the bottom electrode contact 102) causes the phase change material layer 106 to be heated and transformed, assuming correct pulse shape, from one state to another. As described again below, the most heat due to this current is created at the junction between the bottom electrode 104 and the phase change material layer 106.

Figure 2:
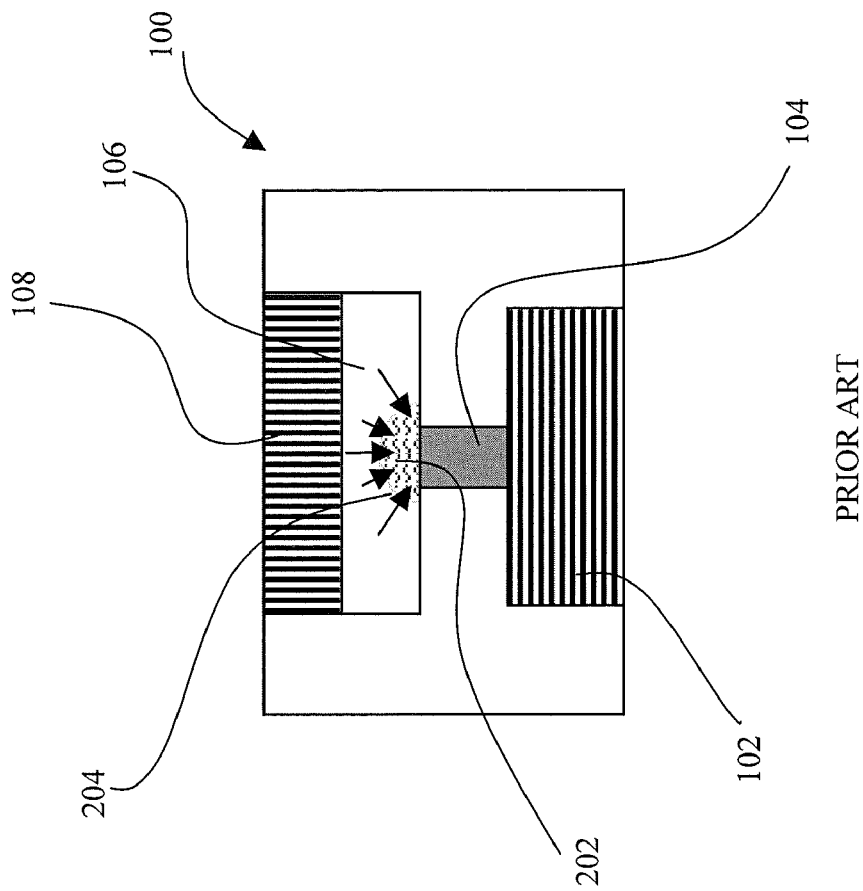
FIG. 2 shows an example of a prior art phase-change memory device in operation.

FIG. 2 shows an example of prior art phase-change memory in operation. The phase-change material layer 106 includes an amorphous portion 202 that is being changed into a crystalline state. The arrows show the direction of change. As is well know in the art, the change occurs at the growth front that is at the border between the amorphous portion 202 and the remainder of the phase-change material layer 106.

Figures 3A, 3B:
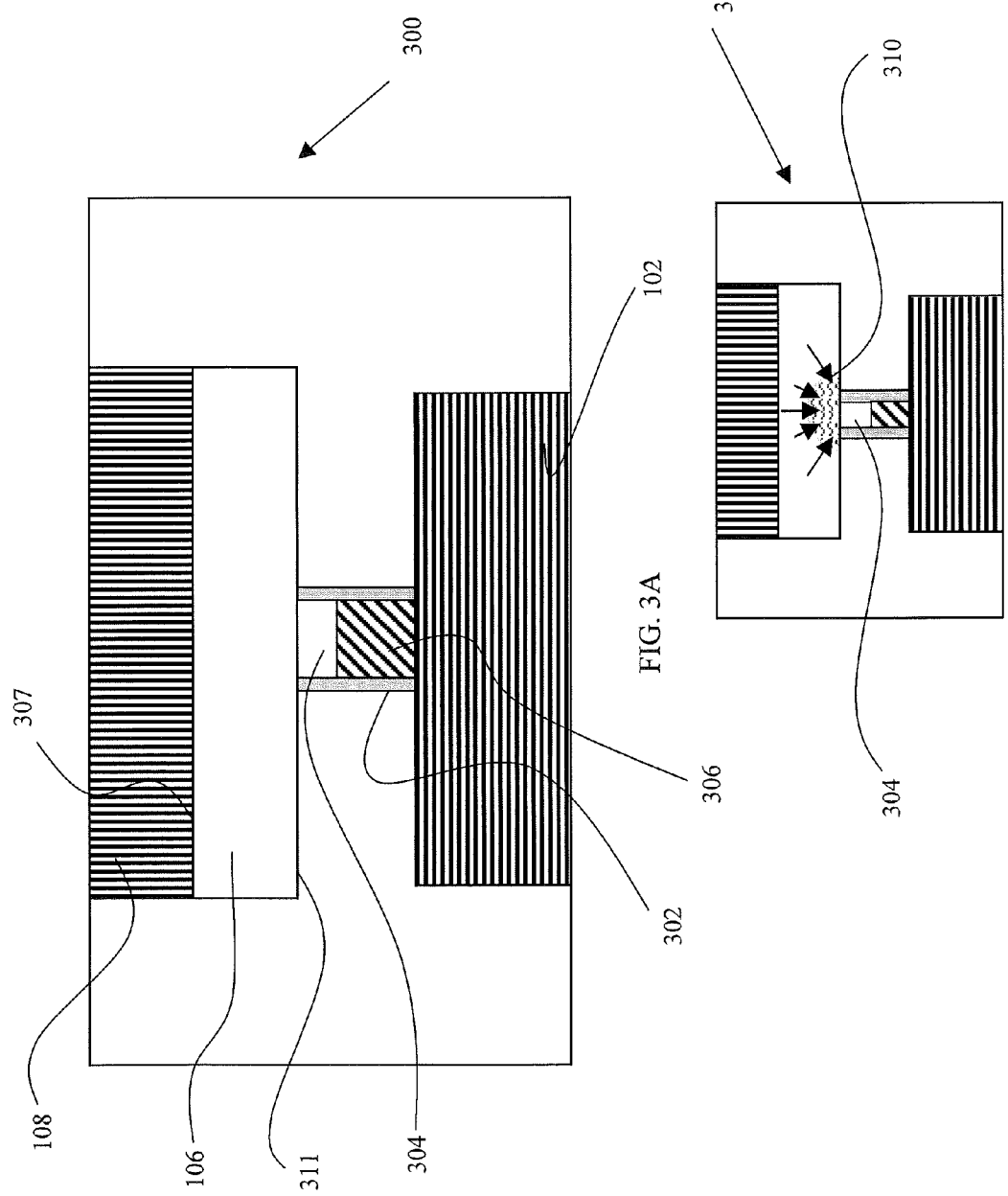
FIG. 3A shows a cut-away side view of an example of a phase-change memory device according to one embodiment of the present of the invention.
FIG. 3B shows the phase-change memory device according to the present invention in operation during a set operation.

FIG. 3A shows a cut-away side view of an example of a phase-change memory device 300 according to one embodiment of the present of the invention. The phase change memory device 300 of this embodiment includes a bottom contact electrode 102. This bottom contact electrode 102, as discussed above, may be connected to either electrical power or ground. The other of power or ground may be connected to the top electrode 108. The bottom contact electrode may also include a bottom electrode 302 connected thereto. As one of ordinary skill in the art will readily realize, the bottom electrode 302 may be unitary with the bottom electrode contact or may be a separate element. Regardless, the bottom electrode 302 of this embodiment includes an outer perimeter and a height as discussed in greater detail below.

The phase-change memory device 300 also includes a phase-change material layer 106 located between the bottom electrode 302 and the top electrode 108. The phase-change material layer 106 may have an upper side 307 in contact with the top electrode 108 and a lower side 311 in contact with the bottom electrode 302.

The phase change material layer 106 may be any material that exhibits the phase change properties discussed above. For example, the phase-change material layer 106 may be a chalcogenide alloy of germanium, antimony and tellurium (GeSbTe) called GST. The phase change material layer 106 is in thermal contact with the bottom electrode 302. That is, application of voltage between the top electrode 108 and the bottom electrode 302 causes a current to pass through the phase-change material layer 106 resulting in heating of the phase-change material layer 106 which, as discussed above, can cause the state of the phase-change material layer 106 to change. The location of greatest heat dissipation has experimentally found to be at the junction of the bottom electrode 302 and the phase-change material layer 106. Of course, the thermal contact between the bottom electrode 302 and the phase-change material need not be direct and other layers could be dispersed between them. In some embodiments, however, the contact between the bottom electrode 302 and the phase-change material layer 106 is direct.

Figure 6B:
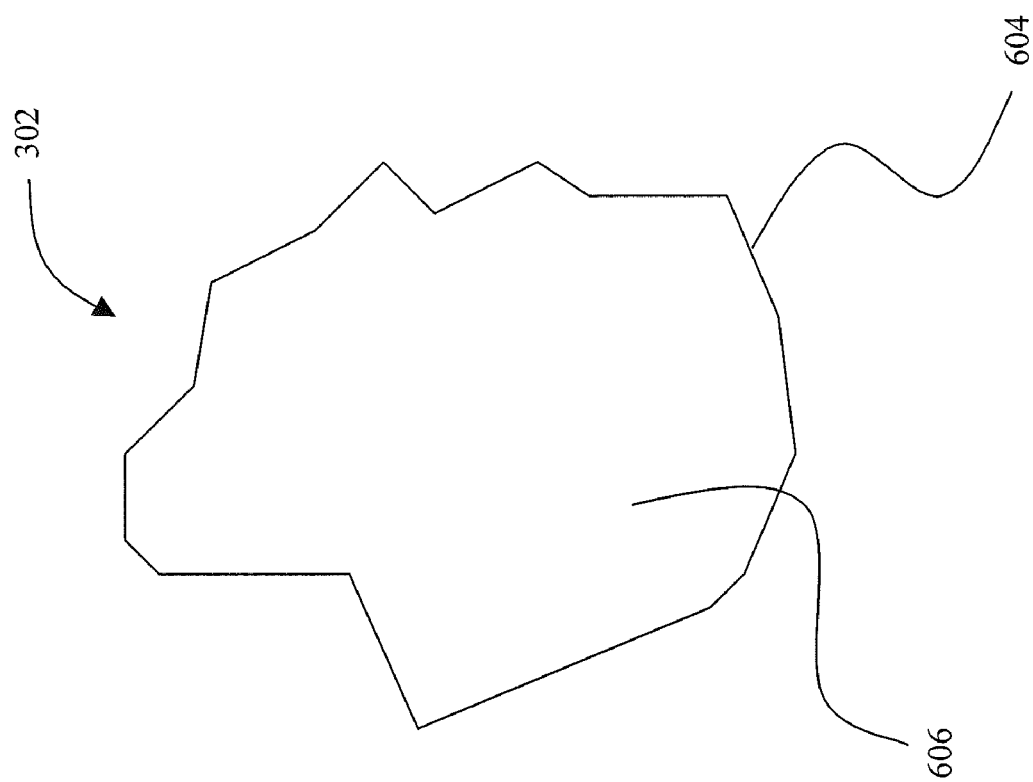
FIG. 6B shows a cross-sectional top view of bottom electrode.
Figure 6A:
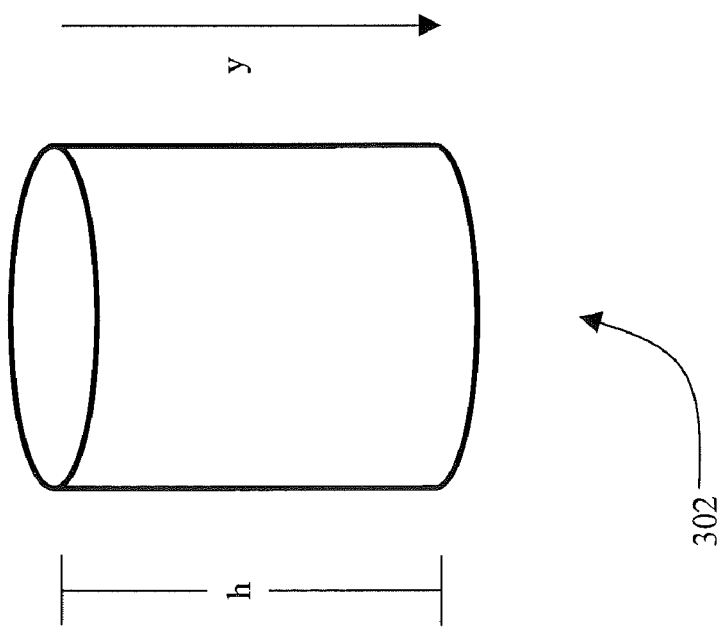
FIG. 6A shows a side view of one embodiment of a bottom electrode.

As discussed above, the bottom electrode may have an outer perimeter and a height. FIG. 6A shows a side view of one embodiment of a bottom electrode 302. This bottom electrode has a height h. As used herein in, an element extends down into the height h of the bottom electrode 302 if the element is within the bottom electrode starting at a top 602 of the bottom electrode 302 and extending in the y direction as indicated in FIG. 6A. FIG. 6B shows a cross-sectional top view of bottom electrode 302. The bottom electrode 302 includes an outer perimeter 604 and an inner portion 606 contained within the outer perimeter 604. In some embodiments, the inner portion 606 of the bottom electrode 302 is hollow. The outer perimeter 604 may take on any shape. In a preferred embodiment, the outer perimeter 604 is circular in cross section and, in such an embodiment, the bottom electrode 302 may be referred to as a ring electrode. The bottom electrode 302 may be made of, for example, but is not limited to, TiN, Si—TiN, Al—TiN, TaN as may the bottom electrode contact and the upper electrode.

Referring again to FIG. 3A, as shown, the bottom electrode 302 includes a seed layer 304 and filler material 306 disposed therein. As shown, the seed layer 304 contacts the perimeter of the bottom electrode 302 and is separated from the bottom contact electrode 102 by the filler material 306. In some embodiments, the seed layer 304 may be a phase-change material. In some embodiments, the seed layer 304 may be composed of the same phase-change material as the phase-change material layer 106. In other embodiments, the seed layer 304 may be a different phase-change material than the phase-change material layer 106. For instance, the seed layer 304 may be similar to the phase-change material layer 106 but have different doping characteristics.

Regardless, the seed layer 304 extends down into the bottom electrode 302 a portion of the height h (FIG. 6A) of the bottom electrode 302. In some embodiments, the seed layer 304 extends down into the bottom electrode 302 a distance great enough that at least a portion of the seed layer 304 remains in its crystalline state during reset operations of the phase change memory device 300. In one embodiment, the seed layer 304 extends down into the bottom electrode 302 more than 10 nano-meters. In other embodiments, the seed layer 304 may extend down any distance up to 50 nano-meters into the bottom electrode 302.

The filler material 306, in some embodiments, may be a dielectric material. In other embodiments, the filler material 306 may be a conductive material.

FIG. 3B shows the phase-change memory device 300 in operation during a set operation. As discussed above, a set operation changes the phase-change material layer 106 from for an amorphous state to a crystalline state. As shown, the phase-change material layer 106 includes an amorphous region 310 that is to be converted into a crystalline state. As discussed above, the crystallization occurs along the growth front at the junction between the amorphous region 310 and the remainder of the phase-change material layer 106. As discussed above, the seed layer 304 has at least a portion thereof that is in a crystalline state. This portion of the seed layer increases the crystallization growth front and, therefore, decreases the time required to convert the amorphous region from an amorphous state to a crystalline state.

Figure 4:
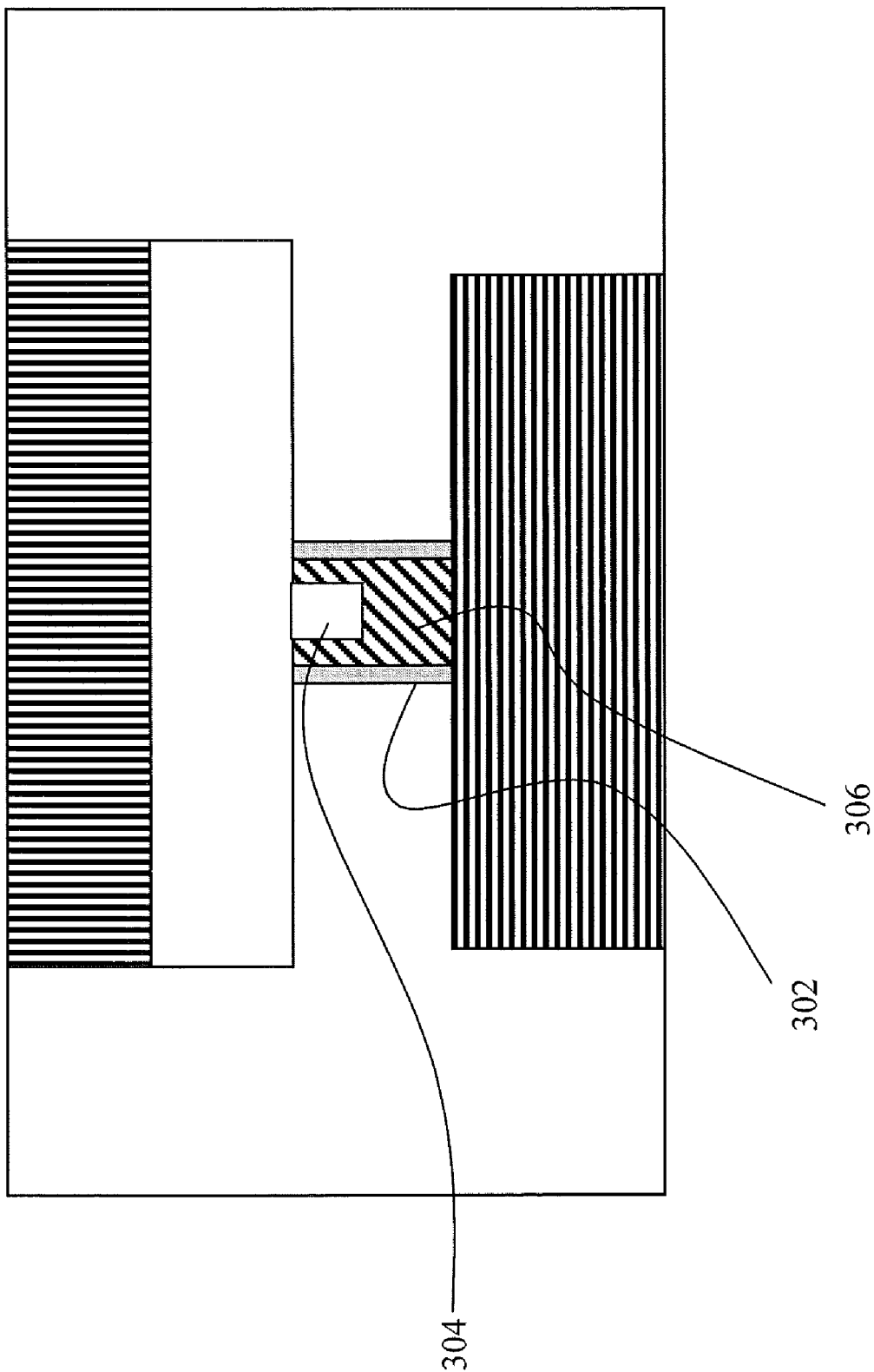
FIG. 4 shows another embodiment of a bottom electrode according to the present invention.

FIG. 4 shows another embodiment of a bottom electrode 302 according to the present invention. In this embodiment, the filler material 306 separates the seed layer 304 from the outer perimeter of the bottom electrode 302.

Figure 5:
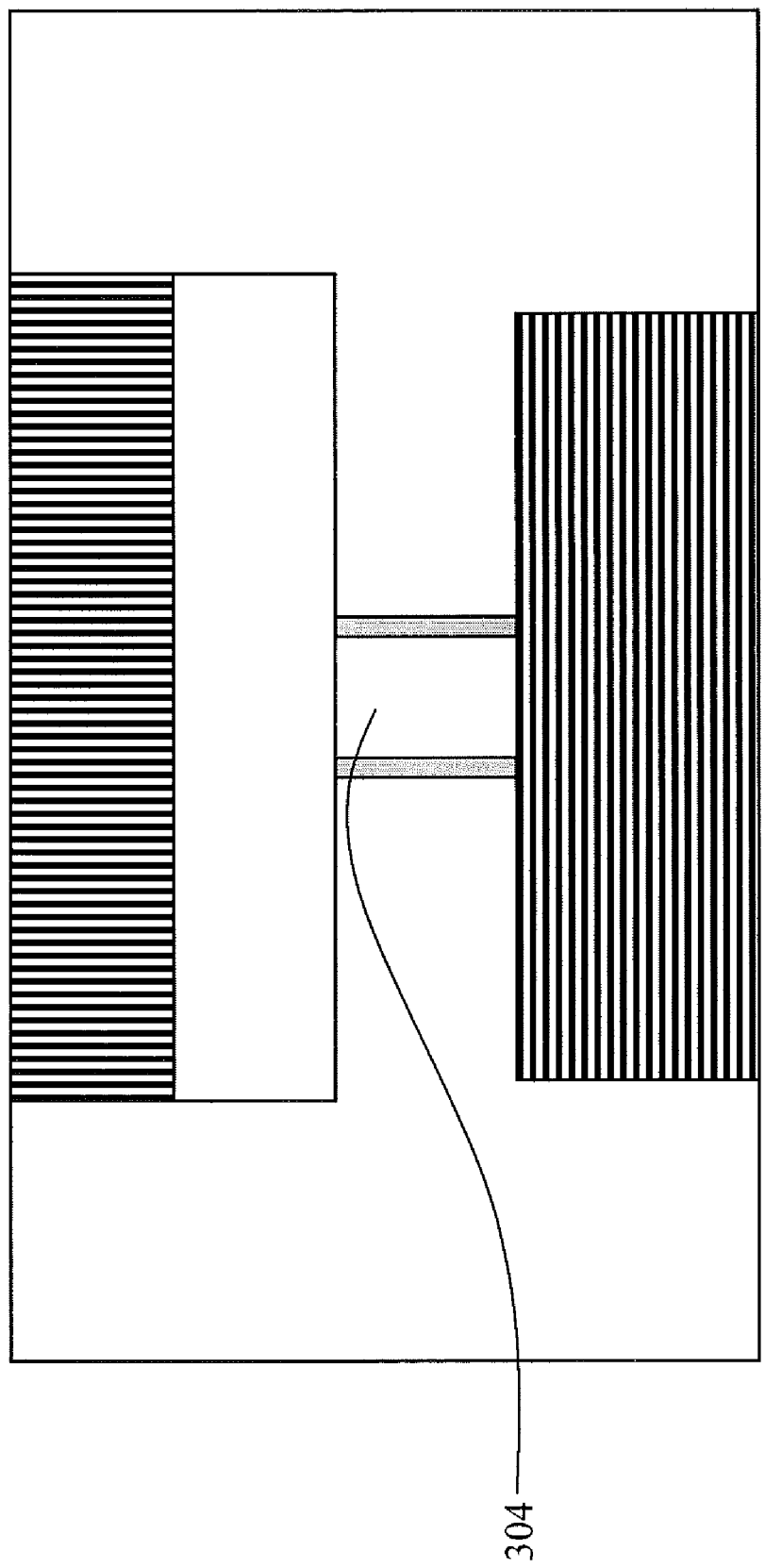
FIG. 5 shows another embodiment of a bottom electrode according to the present invention.

FIG. 5 shows another embodiment of a bottom electrode 302 according to the present invention. In this embodiment, the bottom electrode 302 does not include any filler material and is completely filled by the seed layer 304.

Figure 7:
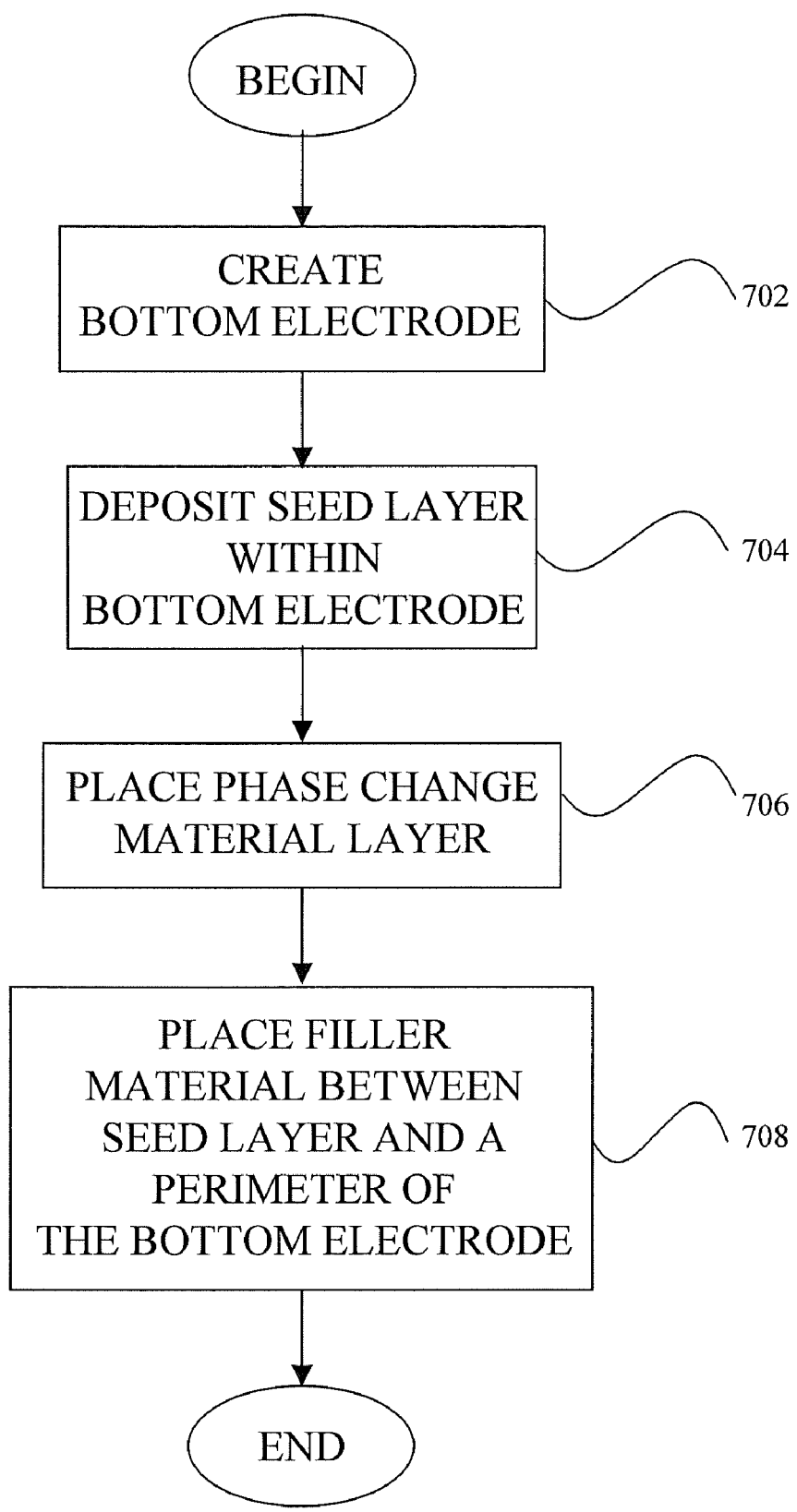
FIG. 7 is a flow diagram of a method in which a bottom electrode according to one embodiment of the present invention may be made or manufactured.

FIG. 7 is a flow diagram of a method in which a bottom electrode according to one embodiment of the present invention may be made. The method as shown is not to limit the order in which any process may be performed. In addition, additional steps may be added or steps removed from the method shown in FIG. 7 without departing from the spirit of the invention disclosed herein.

The method begins at block 702 where a bottom electrode is created. The bottom electrode may, in some embodiments may be created in any manner so long as at least a portion thereof is hollow or may be made to be so. That is, for example, the bottom electrode may be made as a solid element that later has portions from its interior removed. Regardless, at block 704 a seed layer is deposited within the bottom electrode. As discussed above, the seed layer may be deposited within the bottom electrode to any depth within the bottom electrode. At block 706 a phase-change material layer is placed in thermal contact with both the bottom electrode and the seed layer. In some embodiments, the phase-change material layer may be placed such that other elements are physically between it and either the bottom electrode or the seed layer so long as it is in thermal contact with those layers. In one embodiment, the seed layer is in direct contact with the phase-change material layer.

In some embodiments, the method shown in FIG. 7 may also optionally include block 708 where a filler material is placed within the outer perimeter of the bottom electrode such that it separates the seed layer from the outer perimeter of the bottom electrode.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A phase change memory control ring lower electrode comprising:
    an outer ring electrode having an outer perimeter and in thermal contact with a phase change memory element;
    an inner seed layer formed of a phase change material disposed within the outer perimeter of the outer ring electrode and in thermal contact with the phase change memory element, wherein the inner seed layer is separated from the outer ring electrode; and
    an electrically conductive bottom layer coupled to the outer ring electrode.

2. The phase change memory control lower electrode of claim 1, further comprising:
    a first filler material disposed within the outer ring electrode and between the inner seed layer and the electrically conductive bottom layer.

3. The phase change memory control lower electrode of claim 2, wherein the first filler layer separates the inner seed layer from the outer ring electrode.

4. The phase change memory control lower electrode of claim 1, wherein the inner seed layer made of a first phase change material and the phase change material layer is made of a second phase change material.

5. A phase change memory device comprising:
    an upper electrode having an upper side and a lower side;
    a phase change material layer having an upper side and a lower side, the upper side of the phase change material layer contacting the lower side of the upper electrode;
    a bottom electrode having a bottom electrode height and an outer perimeter and in thermal contact with the lower side of the phase change material layer; and
    a seed layer formed of a phase change material disposed within the outer perimeter of the bottom electrode and in contact with the lower side of the phase change material, wherein the seed layer is separated from the perimeter of the bottom electrode.

6. The device of claim 5, wherein the seed layer is in contact with the perimeter of the bottom electrode.

7. The device of claim 6, further comprising:
    a bottom electrode contact in contact with the bottom electrode.

8. The device of claim 7, further comprising:
    a first filler material disposed within the outer perimeter of the bottom electrode and between the seed layer and the bottom electrode contact.

9. The device of claim 7, wherein the seed layer is in contact with the bottom electrode contact.

10. The device of claim 5, further comprising:
    a first filler material disposed within the outer perimeter of the bottom electrode and between the seed layer and the outer perimeter of the bottom electrode.

11. The device of claim 5, wherein the phase change material layer is made of a first phase change material and the seed layer is made of second phase change material.

12. The device of claim 11, wherein the first phase change material is the same as the second phase change material.

13. The device of claim 5, wherein the seed layer extends into the bottom electrode at least a portion of the height of the bottom electrode.

14. The device of claim 5, wherein the bottom electrode has a circular cross section.

\* \* \* \* \*